United States Patent
Ichikura

(10) Patent No.: US 8,203,381 B2
(45) Date of Patent: Jun. 19, 2012

(54) VOLTAGE OUTPUT DEVICE HAVING AN OPERATIONAL AMPLIFIER

(75) Inventor: Hiroyoshi Ichikura, Ibaraki (JP)

(73) Assignee: Lapis Semiconductor Co., Ltd. (JP)

( * ) Notice: Subject to any disclaimer, the term of this patent is extended or adjusted under 35 U.S.C. 154(b) by 0 days.

(21) Appl. No.: 13/050,641

(22) Filed: Mar. 17, 2011

(65) Prior Publication Data
US 2011/0234320 A1    Sep. 29, 2011

(30) Foreign Application Priority Data
Mar. 26, 2010    (JP) ................................. 2010-072349

(51) Int. Cl.
*H03F 1/02* (2006.01)

(52) U.S. Cl. ................. 330/9; 330/69; 330/253

(58) Field of Classification Search ................. 330/9, 69
See application file for complete search history.

(56) References Cited

U.S. PATENT DOCUMENTS

| | | | | |
|---|---|---|---|---|
| 3,988,689 | A * | 10/1976 | Ochi et al. ........................ | 330/9 |
| 6,466,090 | B1 * | 10/2002 | Giuroiu ............................ | 330/86 |
| 7,342,443 | B2 * | 3/2008 | Nishimori ........................ | 330/51 |
| 7,348,839 | B2 * | 3/2008 | Fahim et al. ...................... | 330/9 |
| 7,724,081 | B2 * | 5/2010 | Botker ............................. | 330/9 |
| 7,755,421 | B2 * | 7/2010 | Chen et al. ....................... | 330/9 |
| 7,973,684 | B2 * | 7/2011 | Nolan et al. ..................... | 341/118 |

FOREIGN PATENT DOCUMENTS

| | | |
|---|---|---|
| JP | 11-305735 | 11/1999 |
| JP | 2005-033541 A | 2/2005 |
| JP | 2007-116493 A | 5/2007 |
| JP | 2008-258725 A | 10/2008 |

* cited by examiner

*Primary Examiner* — Patricia Nguyen
(74) *Attorney, Agent, or Firm* — Studebaker & Brackett PC; Don R. Studebaker

(57) ABSTRACT

A voltage output device which is capable of preventing an increase in circuit scale and includes an offset compensation function that is suitably applicable in particular to a drive circuit for display devices such as liquid crystal display panels. The voltage output device includes an operational amplifier which has an inverting input terminal and a non-inverting input terminal. Resistance values of a load resistor on the inverting input side and a load resistor on the non-inverting input side are maintained when the output voltage of the amplifier has changed while sequentially varying either one or both of the resistance values of the load resistor on the inverting input side and the load resistor on the non-inverting input side in a state that the inverting input terminal and the non-inverting input terminal are connected. The voltage output device is configured to output the output voltage of the amplifier with the inverting input terminal not connected to the non-inverting input terminal.

19 Claims, 8 Drawing Sheets

VOLTAGE OUTPUT DEVICE HAVING AN OPERATIONAL AMPLIFIER

BACKGROUND OF THE INVENTION

1. Field of the Invention

The present invention relates to voltage output devices with operational amplifiers, and more particularly, to a technique of compensating for offset in output from an operational amplifier.

2. Description of the Related Art

Operational amplifiers (differential amplifiers) have offset caused by differences in characteristics between input transistors. That is, although the operational amplifier is a circuit component for amplifying the potential difference between the input terminals, the operational amplifier provides non-zero output voltages even when the same voltage is applied to both the input terminals. Such offset in the operational amplifier has been eliminated, for example, using conventional techniques as follows. Disclosed in Japanese Patent Kokai No. 2005-33541 (Patent Literatures 1) is an offset voltage compensation circuit, which includes a comparator for comparing the output voltage from the operational amplifier with a reference voltage to detect an offset voltage of the operational amplifier. The circuit also includes a counter for incrementing or decrementing count values by a value corresponding to the magnitude of the offset voltage, and a register for varying the resistance value of a variable resistor, which constitutes the operational amplifier, on the basis of the count value of the counter.

Disclosed in Japanese Patent Kokai No. H11-305735 (Patent Literature 2) is a differential amplifier circuit that constitutes a driver for driving a liquid crystal display panel. This differential amplifier circuit is configured to operate while alternately switching between a pair of input transistors, thereby eliminating offset components when averaged over time.

Japanese Patent Kokai No. H11-305735 (Patent Literature 3) and Japanese Patent Kokai No. 2008-258725 (Patent Literature 4) relate to a method to be employed for a driver circuit for driving liquid crystal display panels. The method includes the steps of detecting the offset of an operational amplifier by comparing the output voltage of the operational amplifier with a reference voltage, and sequentially connecting gain adjustment capacitors to the operational amplifier until the offset disappears.

SUMMARY OF THE INVENTION

An operational amplifier with the pair of input transistors operated by alternately switching therebetween, as disclosed in Patent Literature 2, may be incorporated into a driver for driving liquid crystal display panels. In this case, the liquid crystal elements will experience different voltages at each frame, thereby causing flicker to occur in display images. The operational amplifier as disclosed in Patent Literatures 3 and 4 provides compensation for offset by sequentially varying the capacitance value for gain adjustment. In this case, it is necessary to provide a plurality of capacitors for gain adjustment within an integrated semiconductor circuit, which can cause an increase in chip size when the circuit includes the operational amplifier. Furthermore, as disclosed in Patent Literatures 1, 3, and 4, offset voltages can be detected using a comparator. In this case, the accuracy of the comparator and the stability of the reference voltage are in question to provide offset compensation with high accuracy. Additionally, this arrangement will require an additional comparator for offset detection and a circuit for producing a reference voltage, thus causing increases in circuit scale.

The present invention has been developed in view of the aforementioned problems. It is therefore an object of the present invention to provide a voltage output device which can prevent an increase in circuit scale, and in particular, includes an offset compensation function that is suitably applicable to a drive circuit for display devices such as liquid crystal display panels.

The voltage output device of the present invention includes: an operational amplifier which has an inverting input terminal and a non-inverting input terminal; connection switching means for switching between connection and disconnection of the inverting input terminal to or from the non-inverting input terminal; load resistance changing means for changing either one or both of resistance values of a load resistor on the inverting input side and a load resistor on the non-inverting input side of the operational amplifier with the inverting input terminal and the non-inverting input terminal being mutually connected; and load resistance setting means for allowing resistance values of the load resistor on the inverting input side and the load resistor on the non-inverting input side to be maintained, with the resistance values being obtained when an output voltage of the operational amplifier has changed while, with the inverting input terminal and the non-inverting input terminal mutually connected, either one or both of the resistance values of the load resistor on the inverting input side and the load resistor on the non-inverting input side are sequentially varied. The voltage output device is configured to output the output voltage of the operational amplifier when the inverting input terminal and the non-inverting input terminal are not mutually connected.

The voltage output device of the present invention can be provided in a simpler structure than conventional ones and prevent an increase in circuit scale.

BRIEF DESCRIPTION OF THE DRAWINGS

FIG. 4B is a view illustrating a connection status of an operational amplifier after offset has been compensated for;

DETAILED DESCRIPTION OF THE INVENTION

Figure 1:
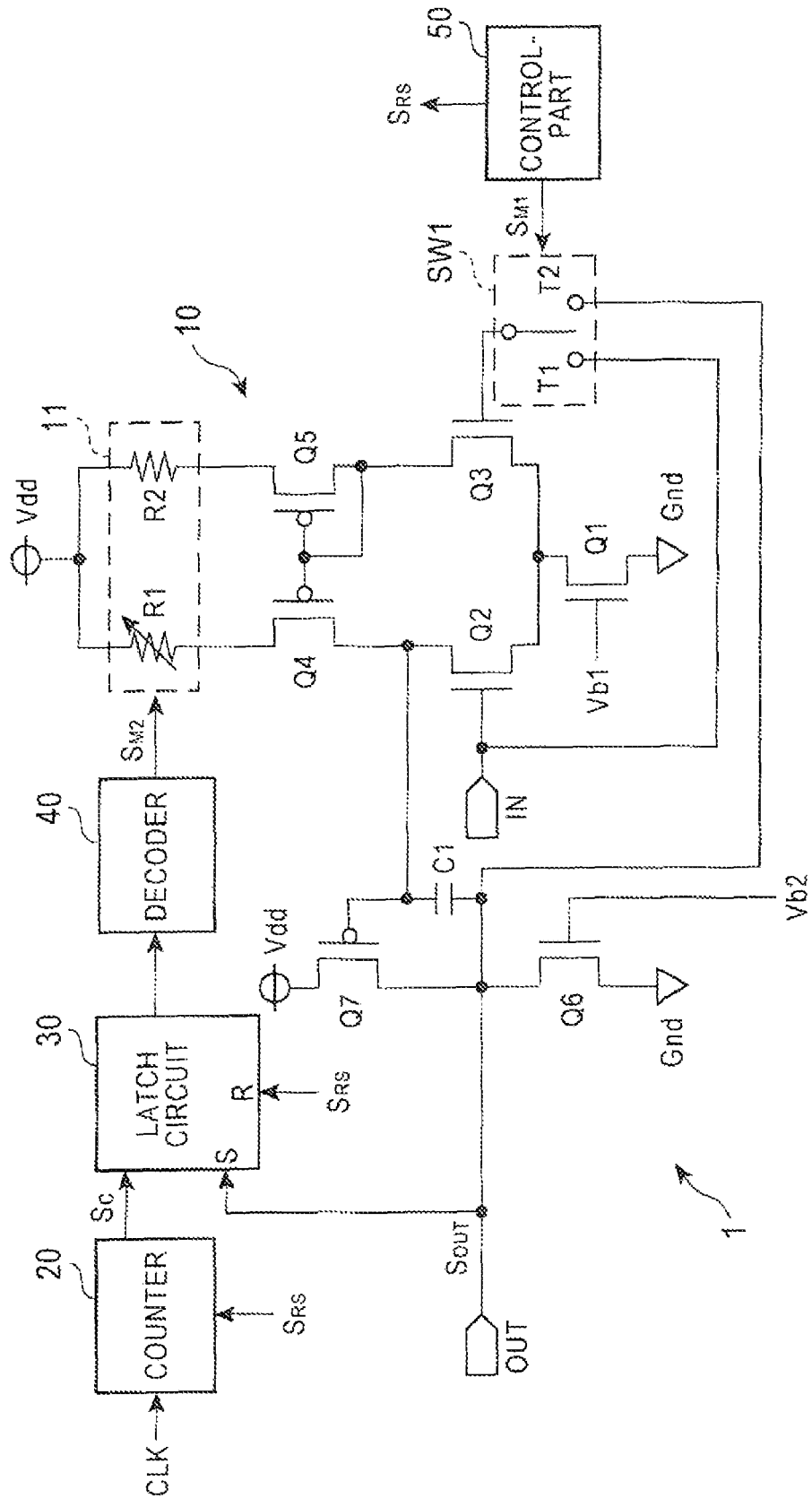
FIG. 1 is a block diagram illustrating the configuration of a voltage output device according to an embodiment of the present invention.

Now, referring to the drawings, the present invention will be described in more detail in accordance with the embodi-

First Embodiment

FIG. 1 is a block diagram illustrating the configuration of a voltage output device 1 having an offset compensation function according to a first embodiment of the present invention. The voltage output device 1 includes an operational amplifier 10 and a switch SW1 for switchably connecting between the input terminals of the operational amplifier 10. The device 1 also includes a counter 20 for counting clock signals CLK externally supplied at predetermined cycles to output a count value Sc, and a latch circuit 30 for holding the count value Sc supplied from the counter 20 according to the voltage level of an output voltage Sout of the operational amplifier 10. The device 1 further includes a decoder 40 for producing a control signal $S_{M2}$ associated with the count value supplied from the latch circuit 30 and setting a resistance value of a variable resistor R1 which constitutes the operational amplifier 10. Also included is a control part 50 for providing switching control to SW1 and reset control to the counter 20 and the latch circuit 30.

The operational amplifier 10 includes N-channel transistors Q2 and Q3 as its input transistors. The gate terminal of the transistor Q2 is connected with an input terminal IN which is equivalent to the non-inverting input terminal of the operational amplifier 10. The gate of the transistor Q3 equivalent to the inverting input terminal of the operational amplifier 10 is connected to the switch SW1. The switch SW1 connects the gate of the transistor Q3 to either an output terminal OUT or the input terminal IN on the basis of a control signal $S_{M1}$ supplied from the control part 50. The sources of the transistors Q2 and Q3 are connected to the drain of an N-channel transistor Q1. The source of the transistor Q1 is connected to a ground potential Gnd. The transistor Q1 is turned into an ON state when supplied with a bias voltage Vb1, and supplies a circuit current to the operational amplifier 10. There are also provided P-channel transistors Q4 and Q5 which form a current mirror circuit and supply the same current to the input transistors Q2 and Q3.

There is a load resistor circuit 11 connected in between the transistors Q4 and Q5 and a power supply line. The load resistor circuit 11 includes the variable resistor R1 which constitutes the load resistor on the non-inverting input side of the operational amplifier 10 and a fixed resistor R2 which constitutes the load resistor on the inverting input side of the operational amplifier 10. The variable resistor R1 is configured to vary its resistance value on the basis of the control signal $S_{M2}$ supplied from the decoder 40. The configuration of the load resistor circuit 11 will be described in more detail later.

The output circuit of the operational amplifier 10 is formed of a P-channel transistor Q7 and an N-channel transistor Q6. The source of the transistor Q7 is connected to the power supply line, and the source of the transistor Q6 is connected to the ground potential Gnd. The drain of the transistor Q7 is connected to the drain of the transistor Q6, and their connection point is connected with the output terminal OUT of the operational amplifier 10. The drain of the transistor Q2 is connected to the gate of the transistor Q7 as well as to the output terminal OUT via a capacitor C1. The gate of the transistor Q6 is supplied with a bias voltage Vb2.

The counter 20 produces the count value Sc by counting the clock signal CLK with a predetermined cycle, and supplies the value Sc to the latch circuit 30. The counter 20 resets the count value Sc in response to a reset signal $S_{RS}$ supplied from the control part 50.

The latch circuit 30 holds the count value Sc supplied from the counter 20 according to the voltage level of the output voltage Sout from the operational amplifier 10, and supplies that count value Sc to the decoder 40. The latch circuit 30 erases that count value Sc in response to the reset signal $S_{RS}$ supplied from the control part 50.

The decoder 40 produces the control signal $S_{M2}$ corresponding to the count value delivered from the latch circuit 30 and supplies the signal $S_{M2}$ to the load resistor circuit 11 of the operational amplifier 10, thus setting the resistance value of the variable resistor R1.

The control part 50, which includes, for example, a microcomputer for executing a control program stored in a memory device (not shown), works on the control program to output the control signal $S_{M1}$ with predetermined timing thereby operating the switch SW1. The control part 50 also outputs the reset signal $S_{RS}$ to reset the counter 20 and the latch circuit 30.

Figure 2:
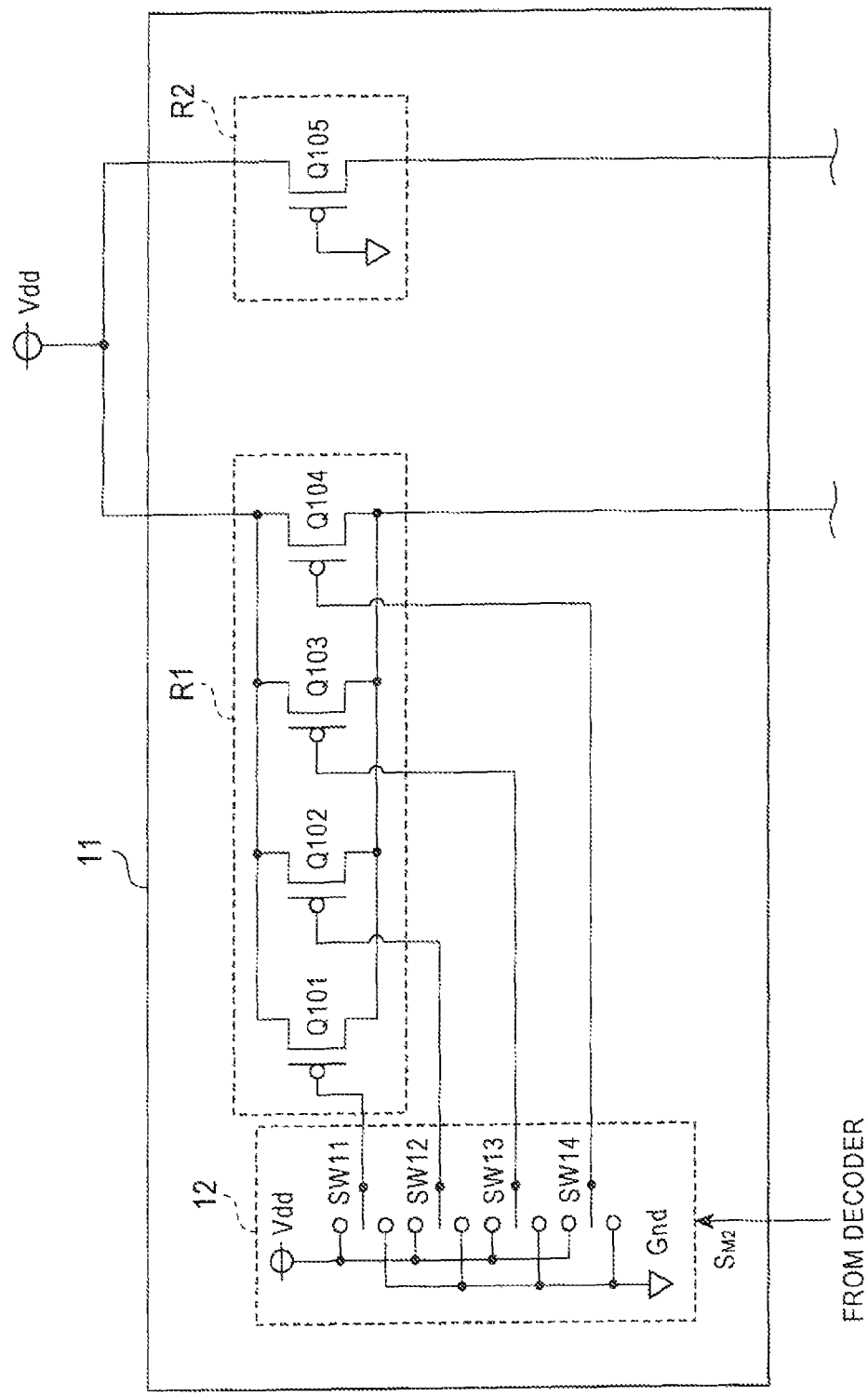
FIG. 2 is a block diagram illustrating the configuration of a load resistor circuit according to an embodiment of the present invention.

FIG. 2 is a circuit diagram illustrating a specific configuration of the load resistor circuit 11. The circuit 11 includes the variable resistor R1 which serves as a load resistor on the non-inverting input side of the operational amplifier 10 and which is realized by P-channel transistors Q101, Q102, Q103, and Q104 connected in parallel. The load resistor circuit 11 has a drive section 12 for individually switching ON or OFF the transistors Q101 to Q104 on the basis of the control signal $S_{M2}$ supplied from the decoder 40. The drive section 12 includes switches SW11 to SW14 which switch the gate potential of the transistors Q101 to Q104 to either a power supply potential Vdd or the ground potential Gnd in response to the control signal $S_{M2}$. The switches SW11 to SW14 are configured to be independently driven in response to the control signal $S_{M2}$ supplied from the decoder 40. The transistors Q101 to Q104 are each turned OFF when the gate is connected to the power supply voltage Vdd side. On the other hand, when the gate is connected to the ground potential Gnd side, the transistors are turned into an ON state to serve as a resistance element. As such, use is made of the ON resistance of the transistors Q101 to Q104 to provide resistance elements.

The transistors Q101 to Q104 are formed to have a predetermined resistance ratio. For example, assuming the resistance value of the transistor Q101 to be one (1), then the resistance value of the transistor Q102 is set to 2, the resistance value of the transistor Q103 set to 3, and the resistance value of the transistor Q104 to 4. That is, the resistance ratio of the transistors Q101 to Q104 is 1:2:3:4. Note that the resistance value is equivalent to the ON resistance value of the transistor. The ON resistance of the transistors Q101 to Q104 can be set according to the size of each transistor.

The resistor R2 serving as a load resistor on the inverting input side of the operational amplifier 10 is formed of a single P-channel transistor Q105. The gate potential of the transistor Q105 is fixed to the ground potential, thereby allowing the transistor Q105 to be kept in an ON state and act as a resistance element. The resistance value of the resistor R2 is set, for example, at 2.5, which is the mean of the resistance values of the transistors Q101 to Q104.

Now, referring to the flowchart shown in FIG. 3, a description will be made to the operation of the voltage output device 1 configured as described above according to the first embodiment of the present invention. The voltage output device 1 is placed into an offset compensation mode at power-ON or with predetermined timing after power-ON in order to operate to compensate for the output offset which occurs in the operational amplifier 10. For example, when the power supply for the voltage output device 1 is turned ON, the control part 50 supplies the reset signal $S_{RS}$ to the counter 20 and the latch circuit 30 as well as supplies the control signal $S_{M1}$ to the switch SW1 in order to connect the gate of the transistor Q3 to the input terminal IN side. Upon reception of the reset signal $S_{RS}$, the counter 20 resets the count value Sc to the initial value "00". Upon reception of the reset signal $S_{RS}$, the latch circuit 30 erases the count value that has been held until then. Until the next set input is supplied, the latch circuit 30 outputs the count value Sc supplied from the counter 20 to the decoder 40 as it is (step S1).

Figure 4A:
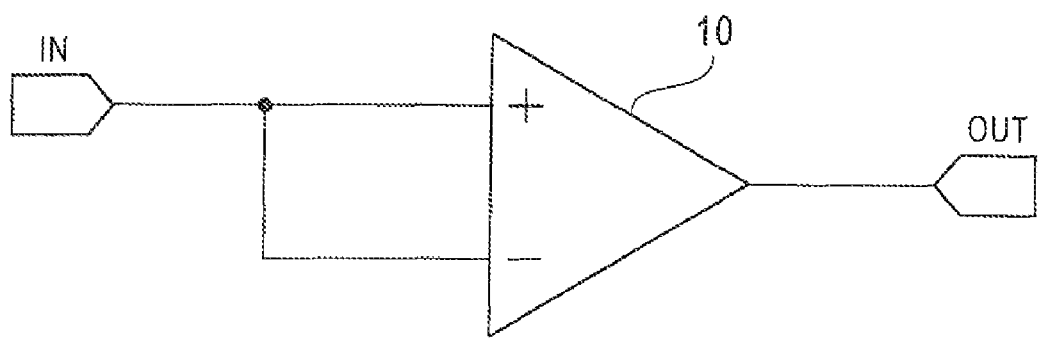
FIG. 4A is a view illustrating a connection status of an operational amplifier in an offset compensation mode.

Upon reception of the control signal $S_{M1}$, the switch SW1 is switched over to contact the terminal T1 side, thereby connecting the gate of the transistor Q3 to the input terminal IN. As shown in FIG. 4A, this causes the operational amplifier 10 to be driven to a short-circuited state with the non-inverting input terminal (the gate of the transistor Q2) and the inverting input terminal (the gate of the transistor Q3) connected to each other (step S2). In such a connection status, the inverting input terminal and the non-inverting input terminal of the operational amplifier 10 are at the same potential; however, the output voltage Sout may be caused to appear at the output terminal OUT at a high level (for example, 5V) or at a low level (for example, 0V) due to an offset. This embodiment is configured such that in the initial stage of the offset compensation mode, the resistance value of the variable resistor R1 is so set that the output voltage Sout is at a low level. That is, the resistance value of the variable resistor R1 is set to the minimum value of a control range. Upon reception of a value "00" supplied from the latch circuit 30 in response to the aforementioned reset operation, the decoder 40 supplies the control signal $S_{M2}$ to the drive section 12 in order to connect the switch SW11 of the drive section 12 to the ground potential Gnd side and connect the switches SW12, SW13, and SW14 to the power supply voltage Vdd side. This causes the transistor Q101 to be driven into an ON state and the transistors Q102 to Q104 to be turned OFF. Thus, the resistance value of the variable resistor R1 takes on a value "1" or the minimum value of the control range. In contrast to this, the resistance value of the fixed resistor R2 is "2.5". Accordingly, the difference (R1−R2) between the load resistor on the non-inverting input side and the load resistor on the inverting input side of the operational amplifier 10 is "−1.5" or the maximum value on the minus side. As such, the balance between the input transistors Q2 and Q3 is lost, thus typically providing the output voltage Sout at a low level.

After having reset the count value Sc, the counter 20 starts all over again to count the clock signal CLK. The count value Sc delivered from the counter 20 is expressed, for example, by binary number in two bits. That is, the counter 20 sequentially outputs the count value Sc expressed by "00", "01", "10", or "11" each time the clock signal is counted (step S3).

Upon reception of a count value "01" from the counter 20, the latch circuit 30 supplies the value to the decoder 40 as it is. Upon reception of the count value "01", the decoder 40 supplies the control signal $S_{M2}$ to the drive section 12 in order to connect the switch SW12 to the ground potential Gnd side and connect the switches SW11, SW13, and SW14 to the power supply voltage Vdd side. This causes the transistor Q102 to be driven into an ON state and the transistors Q101, Q103, and Q104 to be turned OFF, so that the resistance value of the variable resistor R1 takes on a value "2" (step S4). The change in the value of the variable resistor R1 from "1" to "2" causes the balance between the transistors Q2 and Q3 to change from the immediately preceding state.

With the resistance value of the variable resistor R1 being set at "2", the output voltage Sout may be still at a low level (step S5 No). In this case, the latch circuit 30 provides the decoder with the count value Sc "10" supplied from the counter 20. That is, the latch circuit 30 sequentially outputs the count value supplied from the counter 20 until the output voltage Sout is inverted. The decoder 40 accordingly produces the control signal $S_{M2}$ to sequentially increase the resistance value of the variable resistor R1.

Table 1 shows the relationship between the count value of the counter 20, the ON/OFF status of each of the transistors which constitute the variable resistor R1, and the resistance value of the variable resistor R1. In the right column of Table 1, shown is the difference in resistance value between the variable resistor R1 and the resistor R2, i.e., the difference (R1−R2) between the load resistor on the non-inverting input side and the load resistor on the inverting input side.

TABLE 1

| COUNT VALUE | R1 | | | | R1 RESISTANCE VALUE | R2 RESISTANCE VALUE | R1 − R2 |
| --- | --- | --- | --- | --- | --- | --- | --- |
| | Q101 | Q102 | Q103 | Q104 | | | |
| 00 | ON | OFF | OFF | OFF | 1 | 2.5 | −1.5 |
| 01 | OFF | ON | OFF | OFF | 2 | | −0.5 |
| 10 | OFF | OFF | ON | OFF | 3 | | 0.5 |
| 11 | OFF | OFF | OFF | ON | 4 | | 1.5 |

Each time the count value of the counter 20 is sequentially incremented, the resistance value of the variable resistor R1 increases from one to four in increments of one. The difference in resistance value between the variable resistor R1 and the resistor R2 (having a constant resistance value of 2.5) or (R1−R2) varies from −1.5 to 1.5 in increments of one. In this manner, each time the counter is incremented, the difference between the load resistor R1 on the non-inverting input side and the load resistor R2 on the inverting input side of the operational amplifier 10 is varied, thereby varying the balance between the input transistors Q2 and Q3 each time the counter is incremented. When such a variation in the balance works to completely cancel out the offset of the operational amplifier 10, that is, when the offset of the operational amplifier 10 has been compensated for, the output voltage Sout of the operational amplifier 10 is inverted to a high level ("Yes" in step S5). Such an output voltage Sout at the high level is supplied to the set input of the latch circuit 30.

Based on such a set input, the latch circuit 30 holds the count value Sc available when the output signal Sout is inverted. The latch circuit 30 holds the count value Sc and continues to output it until the reset signal $S_{RS}$ is supplied from the control part 50 (step S6). The decoder 40 supplies the control signal $S_{M2}$ to the drive section 12 in response to the count value continuously delivered from the latch circuit 30. This allows the variable resistor R1 to be maintained at a resistance value associated with the amount of offset of the operational amplifier 10, thus completing the offset compensation.

Figure 4B:
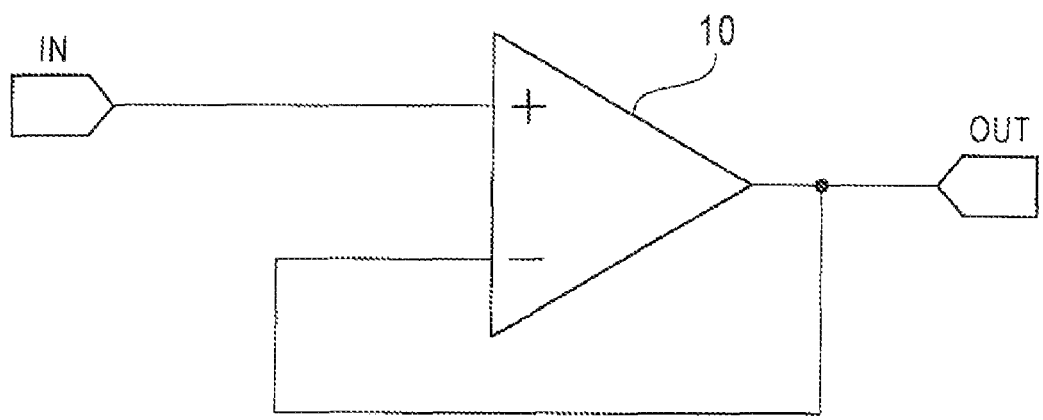

When triggered by the inversion of the output from the operational amplifier 10, the control part 50 supplies the control signal $S_{M1}$ to the switch SW1 in order to connect the gate of the transistor Q3 to the output terminal OUT side. Upon reception of such a control signal $S_{M1}$, the switch SW1 is switched to the terminal T2 side, thereby connecting the gate of the transistor Q3 to the output terminal OUT. This allows the operational amplifier 10 to form a voltage follower as shown in FIG. 4B (step S7). In this manner, the process completes its operation in the offset compensation mode. Note that this embodiment is configured to form a voltage follower by the operational amplifier 10 after the completion of offset compensation; however, the invention is not limited thereto. It is also possible to realize a suitable circuit configuration as appropriate to meet the requirements for the voltage output device of the present invention. For example, after an offset compensation, the operational amplifier 10 may be formed into such a circuit that functions as a comparator or a computing circuit.

As can be seen from the above discussions, the voltage output device according to an embodiment of the present invention provides an output voltage when the inverting input terminal and the non-inverting input terminal of the operational amplifier is short-circuited in the offset compensation mode. Based on this output voltage, the difference between the load resistor R1 on the non-inverting input side and the load resistor R2 on the inverting input side is adjusted for offset compensation. This will thus require no alternate operations for switching between the input transistors for the operation of the circuit. It is also not necessary to provide a plurality of capacitors for gain adjustments or comparators for offset detections, thereby preventing an increase in circuit scale when compared with conventional circuit arrangements.

Figure 5:
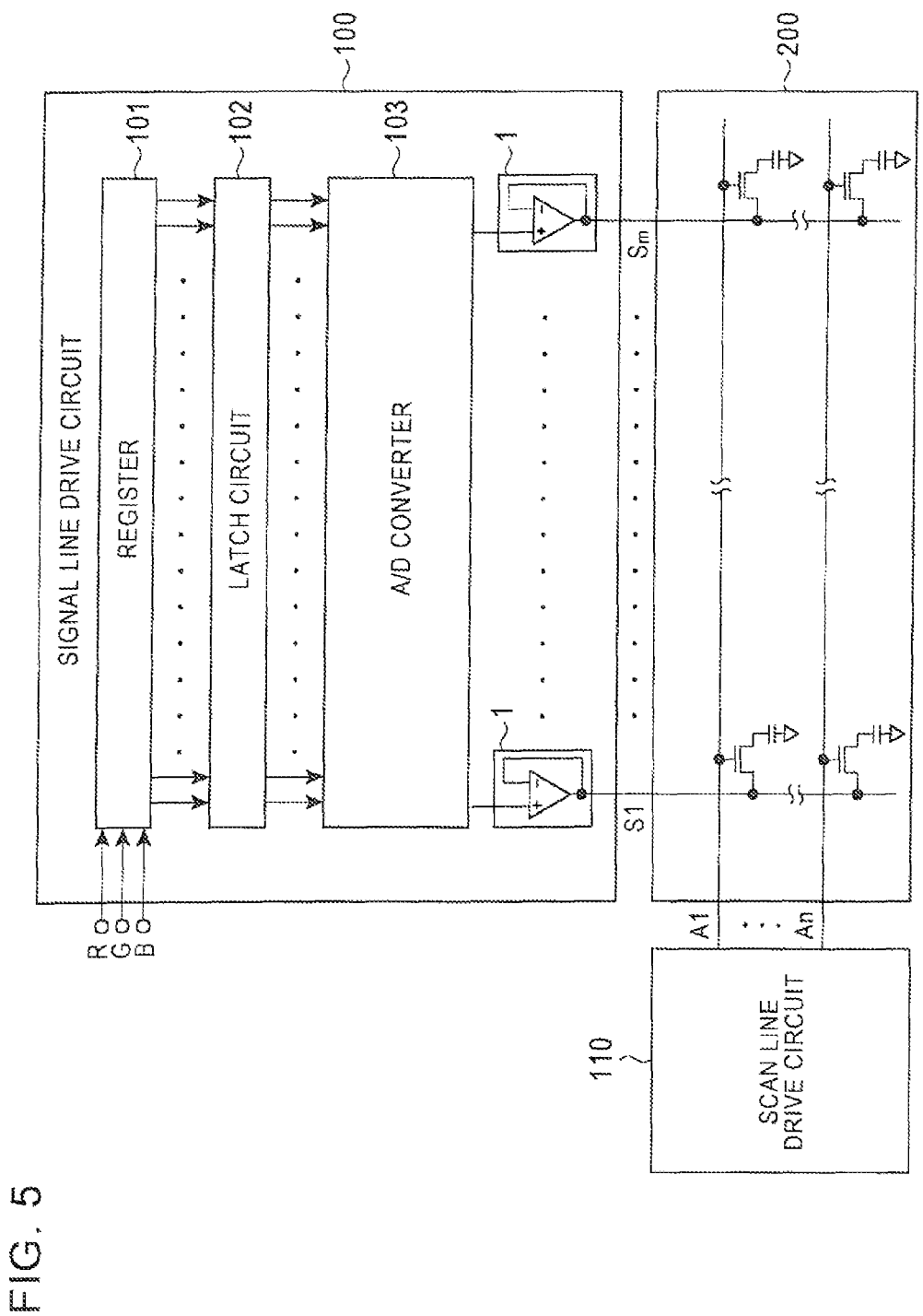
FIG. 5 is a view illustrating the configuration of a liquid crystal display with a voltage output device according to an embodiment of the present invention.

FIG. 5 illustrates the configuration of a liquid crystal display device in which the voltage output device 1 according to an embodiment of the present invention is applied to the drive circuit of a liquid crystal panel 200.

The liquid crystal panel 200 includes m signal lines S1 to Sm and n scan lines A1 to An that intersect the lines S1 to Sm. At each of the intersections of the signal lines and the scan lines, formed is a liquid crystal capacitor serving as the pixel via the thin-film transistor (TFT). Each TFT has the source connected to one of the signal lines S1 to Sm and the gate connected to one of the scan lines A1 to An. Each liquid crystal capacitor is formed by the pixel electrode connected to the TFT, the counter electrode located to oppose the pixel electrode, and a liquid crystal material that is sandwiched via an alignment film between the pixel electrode and the counter electrode.

The display device has a signal line drive circuit 100, which in turn includes a register 101 for storing externally supplied digital display signals R, G, and B, a latch circuit 120 for holding the digital display signals in sync with a strobe signal ST, and an A/D converter 140 for digital to analog conversion of the digital display signals. The voltage output device 1 according to an embodiment of the present invention, which constitutes a voltage follower, is disposed between the signal lines S1 to Sm and the A/D converter 140 to adjust the impedance of the display signal delivered from the A/D converter 140 for output to each of the signal lines S1 to Sm.

Each of the scan lines A1 to An is supplied sequentially with a scan pulse every frame period from a scan line drive circuit 110. The scan pulse selects a TFT, through which a display signal supplied from the signal line drive circuit 100 via the corresponding signal line is applied to the liquid crystal capacitor. As a result, the liquid crystal material sandwiched between the pixel electrode and the counter electrode exhibits the light transmittance associated with the voltage level of the supplied display signal. This allows data to be written onto all the liquid crystal pixels on the selected scan lines. Such a write operation is performed on all the scan lines A1 to An, thereby completing one frame of the screen. The data having been written onto the liquid crystal pixel is accumulated in the capacitor within the pixel, and its voltage is held until the subsequent data is written thereon.

As such, the voltage output device 1 according to an embodiment of the present invention can be incorporated into the drive circuit of a liquid crystal panel, in the case of which offset compensation is made, for example, every frame period.

Second Embodiment

Now, a description will be made to a voltage output device according to a second embodiment of the present invention. The voltage output device according to the second embodiment is characterized in that the resistance value and the resistance ratio of the P-channel transistors Q101, Q102, Q103, and Q104 which constitute the variable resistor R1 are set differently than in the first embodiment. Except for these settings, the second embodiment has the same components and arrangements as the first embodiment.

In the present embodiment, assuming that the transistor Q101 has a resistance value of 2.4, the transistor Q102 is set to a resistance value of 4, the transistor Q103 set to a resistance value of 12, and the transistor Q104 to a resistance value of 4. That is, in the present embodiment, the resistance ratio of the transistors Q101 to Q104 is 2.4:4:12:4. The fixed resistor R2 which constitutes the load resistor circuit 11 is formed of a single P-channel transistor Q105, which has a resistance value of 2.5.

The voltage output device according to the second embodiment operates in accordance with the flowchart shown in FIG. 4 as in the first embodiment. That is, in the offset compensation mode, the difference between the load resistor R1 on the non-inverting input side and the load resistor R2 on the inverting input side is adjusted for offset compensation on the basis of the output voltage available when the inverting input terminal and the non-inverting input terminal of the operational amplifier are short-circuited. Table 2 shows the relationship between the count value of the counter 20, the ON/OFF status of each of the transistors which constitute the variable resistor R1, and the resistance value of the variable resistor R1. Table 2 shows in the rightmost column the difference (R1−R2) between the load resistor on the non-inverting input side and the load resistor on the inverting input side.

TABLE 2

| COUNT VALUE | R1 | | | | R1 RESISTANCE VALUE | R2 RESISTANCE VALUE | R1 − R2 |
|---|---|---|---|---|---|---|---|
| | Q101 | Q102 | Q103 | Q104 | | | |
| 00 | ON | ON | ON | ON | 1 | 2.5 | −1.5 |
| 01 | OFF | ON | OFF | ON | 2 | | −0.5 |
| 10 | OFF | OFF | ON | ON | 3 | | 0.5 |
| 11 | OFF | OFF | OFF | ON | 4 | | 1.5 |

As shown in Table 2, the relationship between the count value and the resistance value of the variable resistor R1 is the same as that of the first embodiment. However, the transistors Q101 to Q104 are turned ON or OFF differently than in the first embodiment when setting each resistance value.

The counter 20 sequentially outputs the count value Sc expressed by "00", "01", "10", or "11" each time clock signals are counted. Upon reception of a count value "00" via the latch circuit 30, the decoder 40 produces the control signal $S_{M2}$ to connect all the switches SW11 to SW14 of the drive section 12 to the ground potential Gnd side, and then supplies the signal $S_{M2}$ to the drive section 12 of the load resistor circuit 11. This causes all the transistors Q101 to Q104 to be turned into an ON state, allowing the variable resistor R1 to have a combined resistance value of "1". Upon reception of a count value "01" via the latch circuit 30, the decoder 40 produces the control signal $S_{M2}$ to connect the switches SW12 and SW14 of the drive section 12 to the ground potential Gnd side and the switches SW11 and SW14 to the power supply voltage Vdd side, and then supplies the signal $S_{M2}$ to the drive section 12 of the load resistor circuit 11. This causes the transistors Q102 and Q102 to be turned ON, allowing the variable resistor R1 to have a combined resistance value of "2". Upon reception of a count value "10" via the latch circuit 30, the decoder 40 produces the control signal $S_{M2}$ to connect the switches SW13 and SW14 of the drive section 12 to the ground potential Gnd side and the switches SW11 and SW12 to the power supply voltage Vdd side, and supplies the signal $S_{M2}$ to the drive section 12 of the load resistor circuit 11. This causes the transistor Q103 and Q104 to be turned into an ON state, allowing the variable resistor R1 to have a resistance value of "3". Upon reception of a count value "11" via the latch circuit 30, the decoder 40 produces the control signal $S_{M2}$ to connect the switch SW14 of the drive section 12 to the ground potential Gnd side and the switches SW11 to SW13 to the power supply voltage Vdd side, and then supplies the signal $S_{M2}$ to the drive section 12 of the load resistor circuit 11. This causes the transistor Q104 to be turned ON, allowing the variable resistor R1 to have a resistance value of "4". As such, in the voltage output device according to the second embodiment, the variable resistor R1 takes on a combined resistance of one or two or more transistors. The difference (R1–R2) in the resistance value between the variable resistor R1 and the resistor R2 (having a constant resistance value of 2.5) varies from –1.5 to 1.5 in increments of one.

This embodiment is the same as the first embodiment in that the difference between the load resistor R1 on the non-inverting input side and the resistor R2 on the inverting input side of the operational amplifier 10 is varied to thereby change the balance between the input transistors Q2 and Q3 for offset compensation. When such a variation in the balance works so as to completely cancel out the offset of the operational amplifier 10, that is, when the offset of the operational amplifier 10 has been compensated for, the output voltage Sout of the operational amplifier 10 is inverted to a high level, allowing the count value upon the inversion to be held in the latch circuit 30. The latch circuit 30 holds and continues to output that count value until the reset signal $S_{RS}$ is supplied from the control part 50. The decoder 40 supplies the control signal $S_{M2}$ to the drive section 12 in response to the count value that is continuously delivered from the latch circuit 30. This allows the variable resistor R1 and the resistor R2 to be maintained at a resistance value corresponding to the amount of offset of the operational amplifier 10, thus completing the offset compensation.

Table 3 shows the results of a size comparison of the transistors Q101 to 104 between the first embodiment and the second embodiment.

TABLE 3

|  | Tr | resistance value | device size | total device size |
| --- | --- | --- | --- | --- |
| FIRST EMBODIMENT | q101 | 1 | 12 | 25 |
|  | q102 | 2 | 6 |  |
|  | q103 | 3 | 4 |  |
|  | q104 | 4 | 3 |  |

TABLE 3-continued

|  | Tr | resistance value | device size | total device size |
| --- | --- | --- | --- | --- |
| SECOND EMBODIMENT | q101 | 2.4 | 5 | 12 |
|  | q102 | 4 | 3 |  |
|  | q103 | 12 | 1 |  |
|  | q104 | 4 | 3 |  |

The ON resistance of a transistor is inversely proportional to the device size (area) of the transistor. In this embodiment where the resistance element is formed of transistors, the resistance value can be set depending on the size of the transistor, so that the less the size of the device, the higher the set resistance value becomes. For example, the area of a transistor having an ON resistance of 1 is four times greater than the area of a transistor having an ON resistance of 4.

In the first embodiment, assuming the transistor Q101 of a resistance value of 1 has a device size of 12, the transistor Q102 has a device size of 6, the transistor Q103 has a device size of 4, and the transistor Q104 has a device size of 3, so that the total device size is 25. On the other hand, in the second embodiment, the transistor Q101 has a device size of 5, the transistor Q102 has a device size of 3, the transistor Q103 has a device size of 1, and the transistor Q104 has a device size of 3, so that the total device size is 12. Thus, the second embodiment provides less than half the total size of the first embodiment.

As described above, the voltage output device according to the second embodiment varies the resistance value of the variable resistor R1 in response to the count value of the counter 20. In this case, a combined resistance is formed with one or two or more of the transistors Q101 to Q104 in the variable resistor being in an ON state. Thus, when compared with the first embodiment where the resistance values 1 to 4 are set with only a single transistor being in an ON state, it is possible to significantly reduce the device size.

Third Embodiment

Figure 6:
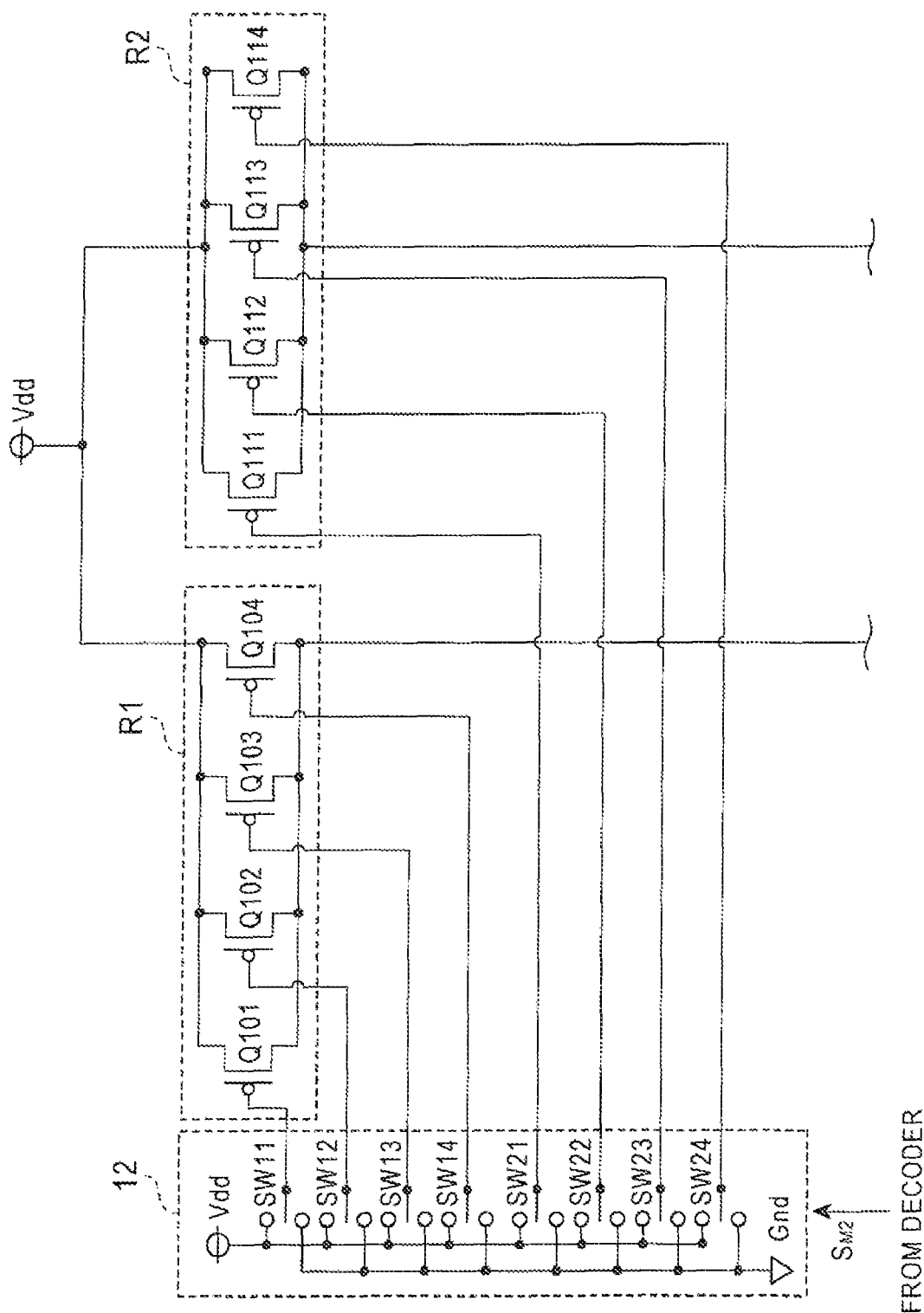
FIG. 6 is a view illustrating the configuration of a load resistor circuit of an operational amplifier according to a third embodiment of the present invention.

Now, a description will be made to a voltage output device according to a third embodiment of the present invention. FIG. 6 illustrates the configuration of the load resistor circuit 11 according to the third embodiment. As described above, the voltage output device according to the first embodiment and the second embodiment is designed such that the load resistor R1 on the non-inverting input side of the operational amplifier 10 is formed of a variable resistor, while the load resistor R2 on the inverting input side is formed of a fixed resistor. By contrast, the third embodiment is configured such that both the resistor R1 serving as the load resistor on the non-inverting input side and the resistor R2 acting as the load resistor on the inverting input side are formed of a variable resistor. Except for this arrangement, the components and arrangements of the third embodiment are the same as those of the first embodiment.

The variable resistor R1 is formed of P-channel transistors Q101, Q102, Q103, and Q104 connected in parallel. Likewise, the variable resistor R2 is also formed of P-channel transistors Q111, Q112, Q113, and Q114 connected in parallel. The drive section 12 has switches SW11 to SW14 and SW21 to SW24 for switching the gate potential of these transistors Q101 to Q104 and Q110 to Q114 to either the power supply potential Vdd or the ground potential Gnd. These switches SW11 to SW24 are to be independently driven in response to the control signal $S_{M2}$ supplied from the decoder 40. The transistors Q101 to Q104 and Q110 to Q114 are turned OFF when the respective gate is connected to the power supply voltage Vdd side. On the other hand, with the gate connected to the ground potential Gnd side, the transistors are turned into an ON state and function as a resistance component.

The transistors Q101 to Q104 and Q110 to Q114 are formed to have a predetermined resistance ratio. For example, assuming that the transistor Q101 has a resistance value of 2.4, the transistor Q102 is set to a resistance value of 4, the transistor Q103 set to a resistance value of 12, the transistor Q104 set to a resistance value of 4, the transistor Q111 to a resistance value of 2.4, the transistor Q112 to a resistance value of 4, the transistor Q113 to a resistance value of 12, and the transistor Q114 to a resistance value of 4. Note that the resistance value is equivalent to the ON resistance of the transistor.

As in the first embodiment, the voltage output device according to the third embodiment operates following the flowchart shown in FIG. 4. That is, in the offset compensation mode, the difference between the load resistor R1 on the non-inverting input side and the load resistor R2 on the inverting input side is adjusted for offset compensation on the basis of the output voltage available when the inverting input terminal and the non-inverting input terminal of the operational amplifier are short-circuited. Table 4 shows the relationship between the count value of the counter 20, the ON/OFF status of each of the transistors which constitute the variable resistors R1 and R2, and the resistance value of the variable resistors R1 and R2. Table 4 shows in the rightmost column the difference (R1−R2) of the resistance value between the variable resistors R1 and R2, that is, the difference between the load resistor R1 on the non-inverting input side and the load resistor R2 on the inverting input side of the operational amplifier 10.

"4". The decoder 40 produces then onwards the control signal $S_{M2}$ and supplies it to the drive section 12 each time clock signals are counted until the output voltage Sout is inverted in order to set the resistance values of the resistor R1 and the resistor R2 respectively to "2" and "4", "3" and "4", "4" and "4", "4", "4" and "3", "4" and "2", and "4" and "1". Accordingly, the difference between the resistance values of the resistor R1 and the resistor R2, that is, the difference (R1−R2) between the load resistor R1 on the non-inverting input side and the load resistor R2 on the inverting input side varies from −3 to 3 in increments of one each time the count is incremented.

This embodiment is the same as the first and second embodiments in that the difference between the load resistors R1 and R2 is varied to thereby change the balance between the input transistors Q2 and Q3 of the operational amplifier 10 for offset compensation. When such a balance variation works to completely cancel out the offset of the operational amplifier 10, i.e., when the offset of the operational amplifier 10 has been compensated for, the output voltage Sout of the operational amplifier 10 is inverted to a high level, so that the count value given upon inversion is held in the latch circuit 30. The latch circuit 30 holds and continues to output that count value until the reset signal $S_{RS}$ is supplied from the control part 50. The decoder 40 supplies the control signal $S_{M2}$ to the drive section 12 in accordance with the count value continuously delivered from the latch circuit 30. This operation allows the variable resistors R1 and R2 to be maintained at the resistance value associated with the amount of offset of the operational amplifier 10, thus completing the offset compensation.

As can be seen from the discussions above, when compared with the first and second embodiments, the third embodiment can provide an extended range of settings for the difference between the load resistor R1 on the non-inverting

TABLE 4

| COUNT VALUE | R1 | | | | R1 RESISTANCE VALUE | R2 | | | | R2 RESISTANCE VALUE | R1 − R2 |
|---|---|---|---|---|---|---|---|---|---|---|---|
| | q101 | Q102 | q103 | q104 | | q111 | q112 | q113 | q114 | | |
| 000 | ON | ON | ON | ON | 1 | OFF | OFF | OFF | ON | 4 | −3 |
| 001 | Off | ON | OFF | ON | 2 | OFF | OFF | OFF | ON | 4 | −2 |
| 010 | OFF | OFF | ON | ON | 3 | OFF | OFF | OFF | ON | 4 | −1 |
| 011 | OFF | OFF | OFF | ON | 4 | OFF | OFF | OFF | ON | 4 | 0 |
| 100 | OFF | OFF | OFF | ON | 4 | OFF | OFF | ON | ON | 3 | 1 |
| 101 | OFF | OFF | OFF | ON | 4 | OFF | ON | OFF | ON | 2 | 2 |
| 111 | OFF | OFF | OFF | ON | 4 | ON | ON | ON | ON | 1 | 3 |

In the offset compensation mode, this embodiment allows for setting the resistance value of both the resistor R1 and the resistor R2 to 1 to 4. Accordingly, the difference between the load resistor R1 on the non-inverting input side and the load resistor R2 on the inverting input side of the operational amplifier 10 can be adjusted in a wider range than in the first and second embodiments described above. It is also possible to adjust the difference between the load resistors in seven stages. The count value Sc delivered from the counter 20 is expressed by 3-bit binary numbers. The counter 20 sequentially outputs the count value Sc expressed by "000" to "110" each time clock signals are counted. Upon reception of a count value "000" via the latch circuit 30, the decoder 40 produces the control signal $S_{M2}$ in order to turn the transistors Q101 to Q104 and Q114 into an ON state, thereby driving the switches SW11 to SW24 of the drive section 12. This causes the resistance value of the variable resistor R1 to be set to "1" and the resistance value of the variable resistor R2 to be set to input side and the load resistor R2 on the inverting input side of the operational amplifier 10. It is also possible to set the difference between the load resistors in seven stages. Suppose that to set the difference between the load resistors in the same manner as in this embodiment, the resistor R1 is formed of a variable resistor and the resistor R2 is formed of a fixed resistor as in the first and second embodiments. In this case, the variable resistor R1 needs to be designed so that it can be set, for example, to resistance values of 1 to 7. This will lead to an increased maximum value of the variable resistor R1, causing an increase in the back bias of the transistor Q4 which constitutes the current mirror circuit. This in turn causes a loss of the balance between the current flowing through the input transistors Q2 and Q3 and the instability of the operation of the operational amplifier 10. On the other hand, as in this embodiment, both the resistors R1 and R2 can be formed of a variable resistor, thereby reducing the maximum value of the resistor R1 and the resistor R2. It is thus possible to provide an extended range for offset compensation while maintaining the stability of the operation of the operational amplifier 10.

Fourth Embodiment

Figure 7:
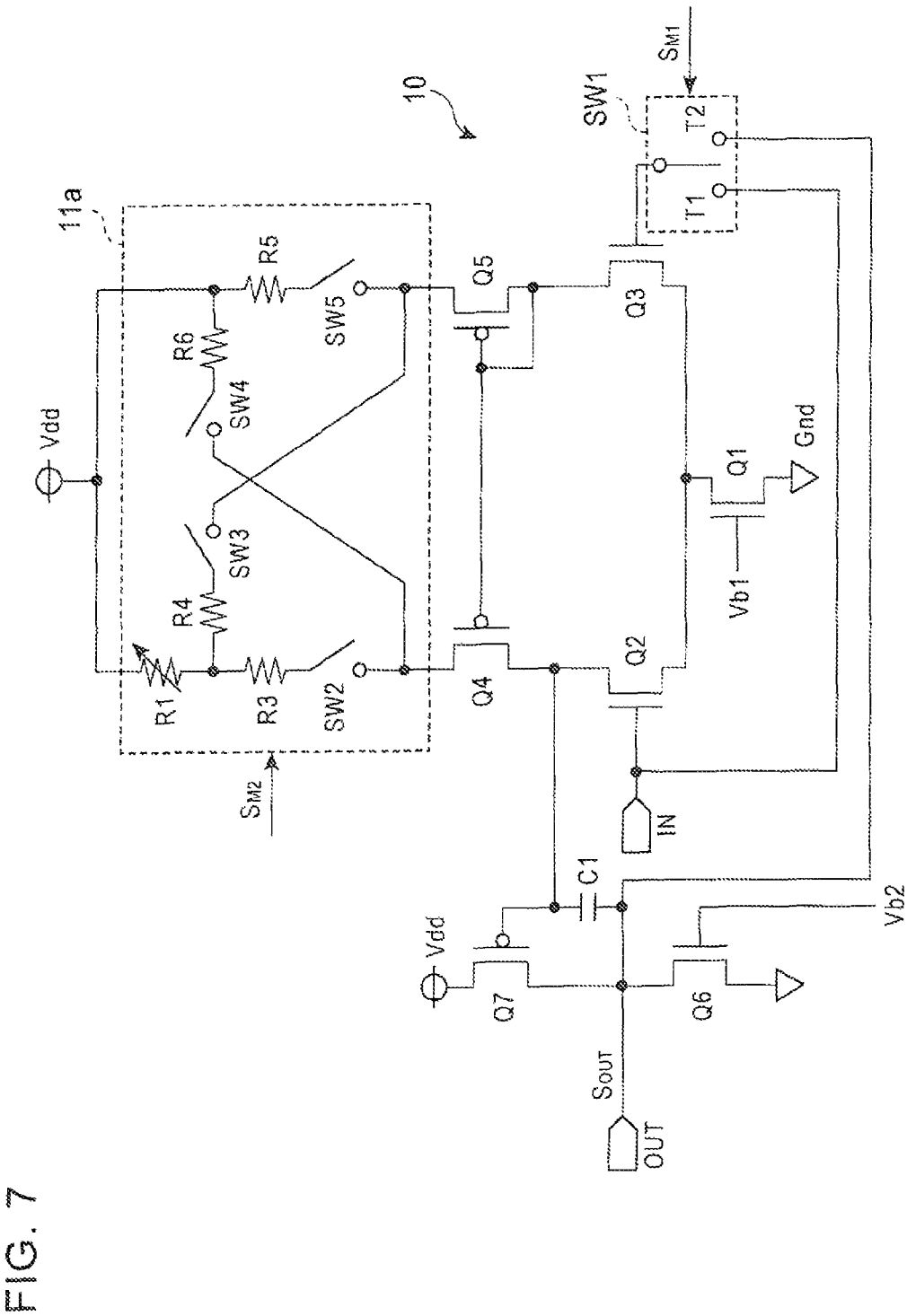
FIG. 7 is an equivalent circuit diagram illustrating the configuration of an operational amplifier according to a fourth embodiment of the present invention.

Now, a description will be made to a voltage output device according to a fourth embodiment of the present invention. FIG. 7 illustrates an equivalent circuit diagram of an operational amplifier 10a according to this embodiment.

The operational amplifier 10a includes N-channel transistors Q2 and Q3 as an input transistor. The input terminal IN of the operational amplifier 10a is connected to the gate terminal of the transistor Q2. The gate of the transistor Q3 is connected to the switch SW1. The switch SW1 connects the gate of the transistor Q3 to either the output terminal OUT or the input terminal IN in response to the control signal $S_{M1}$ supplied from the control part 50. The drain of the N-channel transistor Q1 is connected to the source of the transistors Q2 and Q3. The source of the transistor Q1 is connected to the ground potential Gnd. The transistor Q1 is turned into an ON state by the bias voltage Vb1 being supplied to the gate, thereby allowing a circuit current to be supplied to the operational amplifier 10a. Also found in the operational amplifier 10a are P-channel transistors Q4 and Q5 which constitute a current mirror circuit to supply the same current to the transistors Q2 and Q3.

Between the transistors Q4 and Q5 and the power supply line, there is connected a load resistor circuit 11a. The load resistor circuit 11a includes a variable resistor R1, fixed resistors R3 to R6, and switches SW2 to SW5. The series circuit of the resistors R1 and R3 and the switch SW2 is connected between the power supply line and the source of the transistor Q4. The series circuit of the resistor R5 and the switch SW5 is connected between the power supply line and the source of the transistor Q5. The series circuit of the resistor R4 and the switch SW3 is connected between the midpoint of the resistors R1 and R3 and the source of the transistor Q5. The series circuit of the resistor R6 and the switch SW4 is connected between the power supply line and the source of the transistor Q4. The variable resistor R1 is designed to vary its resistance value in response to the control signal $S_{M2}$ supplied from the decoder 40. The switches SW2 to SW4 are also designed to be driven on the basis of the control signal $S_{M2}$ supplied from the decoder 40. The configuration of the load resistor circuit 11a will be described in more detail later.

The P-channel transistor Q7 and the N-channel transistor Q6 constitute the output circuit of the operational amplifier 10a. The source of the transistor Q7 is connected to the power supply line, while the source of the transistor Q6 is connected to the ground potential. The drain of the transistor Q7 and the drain of the transistor Q6 are connected to each other, and their connection point is connected to the output terminal OUT of the operational amplifier 10a. The drain of the transistor Q2 is connected to the gate of the transistor Q7 and to the output terminal OUT via the capacitor C1 in order to eliminate noise. The gate of the transistor Q6 is supplied with the bias voltage Vb2.

Figure 8:
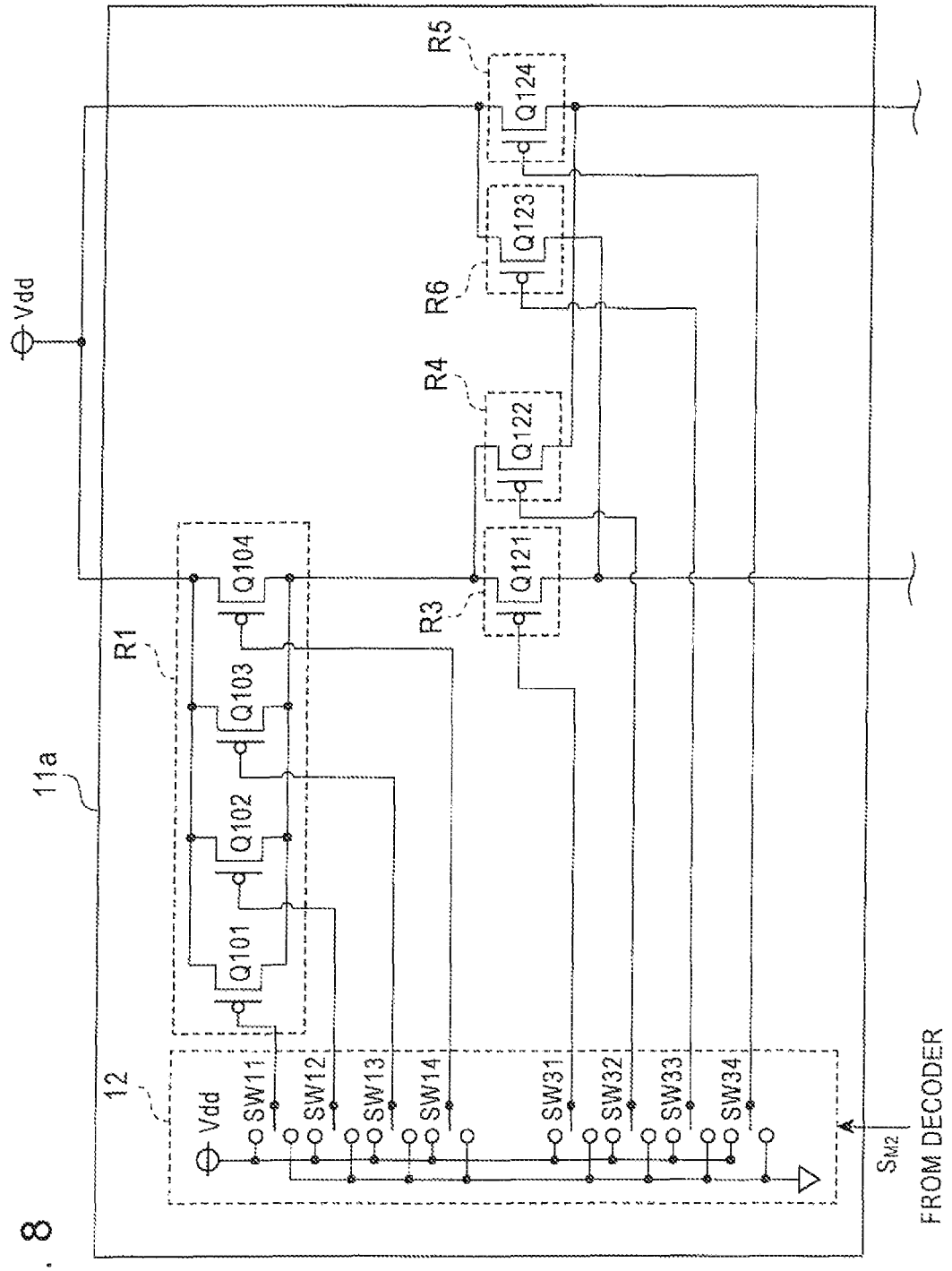
FIG. 8 is a view illustrating the configuration of a load resistor circuit of the operational amplifier according to the fourth embodiment of the present invention.

FIG. 8 is a circuit diagram illustrating a specific configuration of the load resistor circuit 11a. The variable resistor R1 is formed of P-channel transistors Q101, Q102, Q103, and Q104 which are connected in parallel. The resistors R3 to R6 are formed of P-channel transistors Q121 to Q124, respectively. The load resistor circuit 11a has the drive section 12 that switches between the ON and OFF states of the transistors Q101 to Q104 and Q121 to 124 individually in response to the control signal $S_{M2}$ supplied from the decoder 40. The drive section 12 includes the switches SW11 to SW14 and SW31 to SW34 that connect the gate potential of the transistors Q101 to Q104 and Q121 to Q124 to either the power supply potential Vdd or the ground potential Gnd. These switches are designed to operate independently in response to the control signal $S_{M2}$ supplied from the decoder 40. The transistors Q101 to Q104 and Q121 to Q124 are designed to be turned OFF when their gate is connected to the power supply voltage Vdd side, but turned ON when the gate is connected to the ground potential Gnd side to serve as a resistance element. That is, use is made of the ON resistance of each transistor to form the resistance element. The switches SW2 to SW5 are realized by providing ON/OFF control to the transistors Q121 to Q124 which constitute the resistors R3 to R6, respectively.

The transistors Q101 to Q104 and Q121 to Q124 are formed to have a predetermined resistance ratio. For example, assuming that the transistor Q101 has a resistance value of 2.4, the transistor Q102 is set to a resistance value of 4, the transistor Q103 is set to a resistance value of 12, the transistor Q104 set to a resistance value of 4, the transistor Q121 set to a resistance value of 4, the transistor Q122 to a resistance value of 4, the transistor Q123 to a resistance value of 8.5, and the transistor Q124 to a resistance value of 8.5. Note that the resistance value refers to the ON resistance of transistors. The ON resistance of a transistor can be set according to the size of the transistor. The other components and arrangements than the operational amplifier 10a are the same as those of the first to third embodiments described above.

Figure 3:
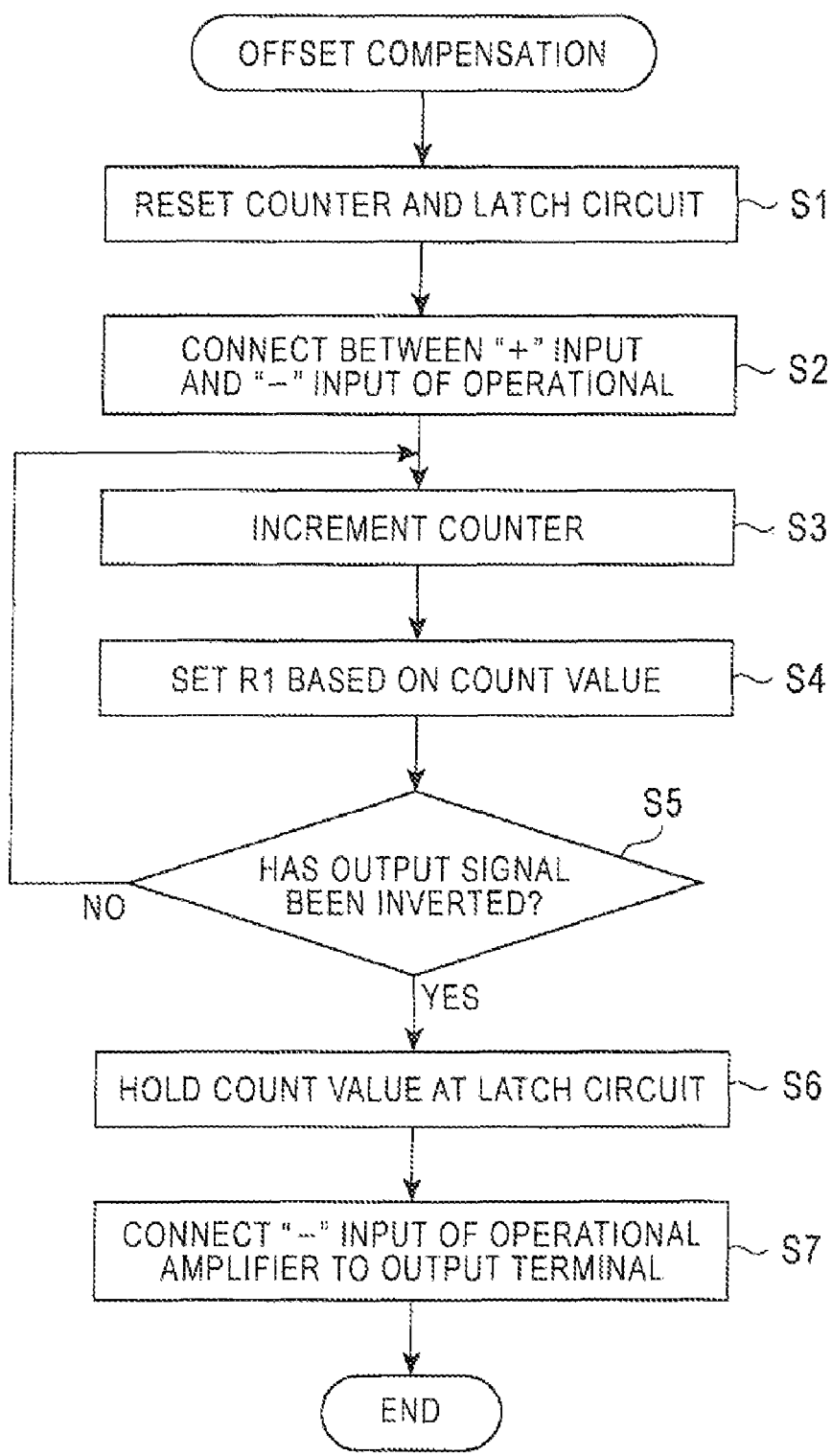
FIG. 3 is a flowchart showing the operation of a voltage output device according to an embodiment of the present invention.

The voltage output device according to the fourth embodiment operates following the flowchart of FIG. 3 as in the first embodiment. That is, in the offset compensation mode, the difference between the load resistor on the non-inverting input side and the load resistor on the inverting input side is adjusted for offset compensation on the basis of the output voltage available when the inverting input terminal and the non-inverting input terminal of the operational amplifier are short-circuited. Tables 5A and 5B show the relationship between the count value of the counter 20, the ON/OFF status of each of the transistors which constitute the resistors R1 and R3 to R6, the resistance value of the load resistor on the non-inverting input side (the "+" input side) of the operational amplifier 10a, and the resistance value of the load resistor on the inverting input side (the "−" input side) of the operational amplifier 10a. Table 5B shows in the rightmost column the difference between the resistance values of the load resistors.

TABLE 5A

| COUNT VALUE | R1 | | | | RESISTANCE VALUE | R3 | R4 | R5 | R6 |
| | Q101 | Q102 | Q103 | Q104 | | Q121 | Q122 | Q123 | Q124 |
| --- | --- | --- | --- | --- | --- | --- | --- | --- | --- |
| 000 | ON | ON | ON | ON | 1 | ON | OFF | OFF | ON |
| 001 | OFF | ON | OFF | ON | 2 | ON | OFF | OFF | ON |
| 010 | OFF | OFF | ON | ON | 3 | ON | OFF | OFF | ON |

TABLE 5A-continued

| | R1 | | | | | | | | |
|---|---|---|---|---|---|---|---|---|---|
| COUNT VALUE | Q101 | Q102 | Q103 | Q104 | RESISTANCE VALUE | R3 Q121 | R4 Q122 | R5 Q123 | R6 Q124 |
| 011 | OFF | OFF | OFF | ON | 4 | ON | OFF | OFF | ON |
| 100 | OFF | OFF | OFF | ON | 4 | OFF | ON | ON | OFF |
| 101 | OFF | OFF | ON | ON | 3 | OFF | ON | ON | OFF |
| 110 | OFF | ON | OFF | ON | 2 | OFF | ON | ON | OFF |
| 111 | ON | ON | ON | ON | 1 | OFF | ON | ON | OFF |

TABLE 5B

| | +INPUT SIDE LOAD RESISTANCE | | −INPUT SIDE LOAD RESISTANCE | | load |
|---|---|---|---|---|---|
| COUNT VALUE | arrangement | RESISTANCE VALUE | arrangement | RESISTANCE VALUE | RESISTANCE DIFFERENCE |
| 000 | r1 + r3 | 5 | r5 | 8.5 | −3.5 |
| 001 | r1 + r3 | 6 | r5 | 8.5 | −2.5 |
| 010 | r1 + r3 | 7 | r5 | 8.5 | −1.5 |
| 011 | r1 + r3 | 8 | r5 | 8.5 | −0.5 |
| 100 | r6 | 8.5 | r1 + r4 | 8 | 0.5 |
| 101 | r6 | 8.5 | r1 + r4 | 7 | 1.5 |
| 110 | r6 | 8.5 | r1 + r4 | 6 | 2.5 |
| 111 | r6 | 8.5 | r1 + r4 | 5 | 3.5 |

In this embodiment, the resistance elements which constitute the load resistor on the non-inverting input side and the load resistor on the inverting input side of the operational amplifier 10a are switched according to the count value. The count value Sc delivered from the counter 20 is expressed by 3-bit binary numbers. The counter 20 sequentially outputs the count value Sc expressed by "000" to "111" each time clock signals are counted. With the count value being "000" to "011", the switch SW2 is closed and the switch SW4 is opened so that the load resistor on the non-inverting input side of the operational amplifier 10a is formed of the series resistance of the resistor R1 and the resistor R3. Additionally, the switch SW3 is opened and the switch SW5 is closed so that the load resistor of the inverting input side is formed of the resistor R5. In this case, the variable resistor R1 which constitutes the load resistor on the non-inverting input side is controlled to increase its resistance value each time the count is incremented. On the other hand, with the count value being "100" to "111", the switch SW2 is opened and the switch SW4 is closed so that the load resistor on the non-inverting input side of the operational amplifier 10a is formed of the resistor R6. Additionally, the switch SW3 is closed and the switch SW5 is opened so that the load resistor on the inverting input side is formed of the series resistance of the resistor R1 and the resistor R4. In this case, the variable resistor R1 which constitutes the load resistor on the non-inverting input side is controlled to decrease its resistance value each time the count is incremented.

Upon reception of a count value "000" via the latch circuit 30, the decoder 40 produces the control signal $S_{M2}$ in order to turn the transistors Q101 to Q104 and Q121 and Q124 into an ON state, thereby driving the switches SW11 to SW14 and SW31 to SW34 of the drive section 12. This operation allows the resistance value of the variable resistor R1 to be set to "1" as well as the load resistor on the non-inverting input side of the operational amplifier 10a to be formed of the series resistance of the resistor R1 and the resistor R3 (having a resistance value of 4). As a result, the load resistor on the non-inverting input side of the operational amplifier 10a is set to a resistance value of "5". On the other hand, the load resistor on the inverting input side of the operational amplifier 10a is formed of the resistor R5 and set to a resistance value of 8.5. During the period with the count value being "000" to "011", the decoder 40 provides control so as to increase the resistance value of the variable resistor R1 by one each time the count is incremented. That is, during the period of the count value being "000" to "011", the resistance value of the load resistor on the non-inverting input side increases from 5 to 8 by one each time the count is incremented, with the load resistor on the inverting input side being maintained at a resistance value of 8.5. Accordingly, during the period of the count value being "000" to "011", the difference between the resistance value of the load resistor on the non-inverting input side and the load resistor on the inverting input side varies in increments of one from −3.5 to −0.5 each time the count is incremented.

Upon reception of a count value "100" via the latch circuit 30, the decoder 40 produces the control signal $S_{M2}$ in order to turn the transistors Q104, Q122, and Q123 into an ON state, thereby driving the switches SW11 to SW14 and SW31 to SW34 of the drive section 12. This operation allows the load resistor on the non-inverting input side of the operational amplifier to be formed of the resistor R6 and set to a resistance value of "8.5". On the other hand, the variable resistor R1 is set to a resistance value of "4", and the load resistor on the inverting input side of the operational amplifier 10a is formed of the series resistance of the resistor R1 and the resistor R4 (having a resistance value of 4). As a result, the load resistor on the inverting input side of the operational amplifier 10a is set to a resistance value of "8". During the period of the count value being "011" to "111", the decoder 40 provides control so as to decrease the resistance value of the variable resistor R1 by one each time the count is incremented. That is, during the period of the count value being "100" to "111", the resistance value of the load resistor on the inverting input side decreases from 8 to 5 by one each time the count is incremented, with the load resistor on the non-inverting input side being maintained at a resistance value of 8.5. Accordingly, during the period of the count value being "100" to "111", the difference of the resistance value between the load resistor on the non-inverting input side and the load resistor on the inverting input side varies in increments of one from 0.5 to 3.5 each time the count is incremented.

This embodiment is the same as the aforementioned first to third embodiments in that the difference between the load resistors on the inverting input side and the non-inverting input side is varied to thereby change the balance between the input transistors Q2 and Q3 of the operational amplifier 10a for offset compensation. When such a balance variation works to completely cancel out the offset of the operational amplifier 10a, i.e., when the offset of the operational amplifier 10a has been compensated for, the output voltage Sout of the operational amplifier 10a is inverted to a high level, so that the count value given upon inversion is held in the latch circuit 30. The latch circuit 30 holds and continues to output that count value until the reset signal $S_{RS}$ is supplied from the control part 50. The decoder 40 supplies the control signal $S_{M2}$ to the drive section 12 in accordance with the count value continuously delivered from the latch circuit 30. This operation allows the load resistor on the non-inverting input side and the load resistor on the inverting input side to be maintained at the resistance value associated with the amount of offset of the operational amplifier 10a, thus completing the offset compensation.

As can be seen from the discussions above, this embodiment enables switching between the resistance elements that constitute the load resistor on the non-inverting input side and the load resistor on the inverting input side of the operational amplifier 10a. This allows the difference between the resistance values of the load resistor on the non-inverting input side and the load resistor on the inverting input side of the operational amplifier 10a to be varied in eight stages from −3.5 to 3.5 in increments of one. The operational amplifier 10a according to this embodiment is configured such that the number of transistors which constitute the resistance elements of the load resistor circuit 11a is the same as that of the third embodiment described above. Additionally, the difference of the resistance value between the load resistors on the inverting input side and on the non-inverting input side can be set in a number of stages greater by one than in the third embodiment, thus providing superior area efficiency. Furthermore, the variable resistor R1 can accommodate variations in the resistance value of each resistance element because the resistor R1 constitutes any one of the load resistor on the non-inverting input side and the load resistor on the inverting input side.

This application is based on Japanese Patent application 2010-072349 which is herein incorporated by reference.

What is claimed is:

1. A voltage output device comprising:
an operational amplifier having an inverting input terminal and a non-inverting input terminal;
connection switching means for switching between connection and disconnection of the inverting input terminal to or from the non-inverting input terminal;
load resistance changing means for changing either one or both of resistance values of a load resistor on the inverting input side and a load resistor on the non-inverting input side of the operational amplifier with the inverting input terminal and the non-inverting input terminal being mutually connected; and
load resistance setting means for allowing resistance values of the load resistor on the inverting input side and the load resistor on the non-inverting input side to be maintained, with the resistance values being obtained when an output voltage of the operational amplifier has changed while with the inverting input terminal and the non-inverting input terminal mutually connected, either one or both of the resistance values of the load resistor on the inverting input side and the load resistor on the non-inverting input side are sequentially varied, wherein
the voltage output device is configured to output the output voltage of the operational amplifier when the inverting input terminal and the non-inverting input terminal are not mutually connected.

2. The voltage output device according to claim 1, wherein the load resistor on the inverting input side and the load resistor on the non-inverting input side comprise an ON-state transistor.

3. The voltage output device according to claim 2, wherein at least one of the load resistor on the inverting input side and the load resistor on the non-inverting input side comprises a plurality of transistors connected in parallel.

4. The voltage output device according to claim 3, wherein the plurality of transistors have ON resistances different from each other.

5. The voltage output device according to claim 3, wherein the load resistance changing means comprises
a counter for outputting a count value obtained by counting predetermined clock pulses,
a decoder for generating a control signal based on the count value, and
a drive section for selectively turning ON and driving the plurality of transistors in response to the control signal.

6. The voltage output device according to claim 5, wherein the drive section turns ON and drives one or two or more transistors in response to the control signal.

7. The voltage output device according to claim 5, wherein the load resistance setting means comprises a hold circuit for holding a count value of the counter according to a voltage level of an output voltage from the operational amplifier, and supplying a held count value to the decoder.

8. The voltage output device according to claim 1, further comprising load resistance switching means for selectively connecting a resistance element to either one of the inverting input side and the non-inverting input side of the operational amplifier.

9. The voltage output device according to claim 1, wherein with the inverting input terminal and the non-inverting input terminal being disconnected from each other, the connection switching means connects either the inverting input terminal or the non-inverting input terminal to an output terminal of the operational amplifier.

10. An offset compensation method for an operational amplifier, the method comprising:
connecting between an inverting input terminal and a non-inverting input terminal of the operational amplifier,
sequentially varying a resistance value of at least one of a load resistor on an inverting input side and a load resistor on a non-inverting input side of the operational amplifier while an output voltage from the operational amplifier is being monitored, and
setting the resistance values of the load resistor on the inverting input side and the load resistor on the non-inverting input side to resistance values at a time when the output voltage from the operational amplifier has changed.

11. A voltage output device comprising:
an operational amplifier having an inverting input terminal and a non-inverting input terminal;

a connection switching part which switches between connection and disconnection of the inverting input terminal to or from the non-inverting input terminal;

a load resistance changing part which changes either one or both of resistance values of a load resistor on the inverting input side and a load resistor on the non-inverting input side of the operational amplifier with the inverting input terminal and the non-inverting input terminal being mutually connected; and a load resistance setting part which allows resistance values of the load resistor on the inverting input side and the load resistor on the non-inverting input side to be maintained, with the resistance values being obtained when an output voltage of the operational amplifier has changed while, with the inverting input terminal and the non-inverting input terminal mutually connected, either one or both of the resistance values of the load resistor on the inverting input side and the load resistor on the non-inverting input side are sequentially varied, wherein the voltage output device is configured to output the output voltage of the operational amplifier when the inverting input terminal and the non-inverting input terminal are not mutually connected.

12. The voltage output device according to claim 11, wherein the load resistor on the inverting input side and the load resistor on the non-inverting input side comprise an ON-state transistor.

13. The voltage output device according to claim 12, wherein at least one of the load resistor on the inverting input side and the load resistor on the non-inverting input side comprises a plurality of transistors connected in parallel.

14. The voltage output device according to claim 13, wherein the plurality of transistors have ON resistances different from each other.

15. The voltage output device according to claim 13, wherein the load resistance changing part comprises a counter for outputting a count value obtained by counting predetermined clock pulses, a decoder for generating a control signal based on the count value, and a drive section for selectively turning ON and driving the plurality of transistors in response to the control signal.

16. The voltage output device according to claim 15, wherein the drive section turns ON and drives one or two or more transistors in response to the control signal.

17. The voltage output device according to claim 15, wherein the load resistance setting part comprises a hold circuit for holding a count value of the counter according to a voltage level of an output voltage from the operational amplifier, and supplying a held count value to the decoder.

18. The voltage output device according to claim 11, further comprising load resistance switching part which selectively connects a resistance element to either one of the inverting input side and the non-inverting input side of the operational amplifier.

19. The voltage output device according to claim 11, wherein with the inverting input terminal and the non-inverting input terminal being disconnected from each other, the connection switching part connects either the inverting input terminal or the non-inverting input terminal to an output terminal of the operational amplifier.

* * * * *